(12) United States Patent
Miller et al.

(10) Patent No.: US 7,776,169 B2
(45) Date of Patent: *Aug. 17, 2010

(54) WATER-BASED SYNTHESIS OF POLY(TETRAZOLES) AND ARTICLES FORMED THEREFROM

(75) Inventors: Cory G. Miller, Rochester, MI (US); Graylon K. Williams, Warren, MI (US)

(73) Assignee: Automotive Systems Laboratory, Inc., Armada, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/497,148

(22) Filed: Jul. 31, 2006

(65) Prior Publication Data

US 2007/0040167 A1   Feb. 22, 2007

Related U.S. Application Data

(63) Continuation-in-part of application No. 11/264,982, filed on Nov. 1, 2005, which is a continuation-in-part of application No. 11/143,198, filed on Jun. 1, 2005.

(60) Provisional application No. 60/704,397, filed on Jul. 31, 2005.

(51) Int. Cl.
*D03D 23/00* (2006.01)
*D03D 43/00* (2006.01)

(52) U.S. Cl. ............... 149/109.6; 149/108.2; 149/109.4

(58) Field of Classification Search .............. 149/109.6, 149/109.4, 108.4
See application file for complete search history.

(56) References Cited

U.S. PATENT DOCUMENTS

| 3,096,312 | A | | 7/1963 | Henry ................... 525/326.7 |
| 3,954,528 | A | * | 5/1976 | Chang et al. ............... 149/19.4 |
| 4,093,570 | A | | 6/1978 | Miyake et al. ........... 260/2.5 B |
| 4,287,277 | A | * | 9/1981 | Matsumoto et al. ............ 430/2 |
| 4,370,181 | A | | 1/1983 | Lundstrom et al. ............. 149/2 |
| 4,558,832 | A | | 12/1985 | Nilsson ..................... 242/374 |
| 4,597,546 | A | | 7/1986 | Yamamoto et al. ....... 242/382.2 |
| 4,909,549 | A | | 3/1990 | Poole et al. ................ 280/738 |
| 4,948,439 | A | | 8/1990 | Poole et al. .................. 149/46 |

(Continued)

FOREIGN PATENT DOCUMENTS

RU   2068420   * 10/1996

(Continued)

OTHER PUBLICATIONS

Overberger et al.; Journal of Polymer Science; vol. XXXIV, pp. 109-120 (1959); Nottingham Symposium.*

(Continued)

*Primary Examiner*—Jerry Lorengo
*Assistant Examiner*—James E McDonough
(74) *Attorney, Agent, or Firm*—L.C. Begin & Associates, PLLC (57) ABSTRACT

A polyvinyl(tetrazole) is formed by a water-based method. A gas generating composition 12 containing the polyvinyl(tetrazole) is contained within an exemplary gas generator 10. An article or gas generating system 200 incorporates the polyvinyl(tetrazole) therein. A vehicle occupant protection system 180 incorporates the gas generating system 200. An article or substrate 300 containing a coating 302 formed from the product of the water-based method is also described.

7 Claims, 5 Drawing Sheets

U.S. PATENT DOCUMENTS

| | | | |
|---|---|---|---|
| 5,035,757 A | 7/1991 | Poole | 149/46 |
| 5,084,118 A | 1/1992 | Poole | 149/22 |
| 5,139,588 A | 8/1992 | Poole | 149/61 |
| 5,197,758 A | 3/1993 | Lund et al. | 280/741 |
| 5,451,008 A | 9/1995 | Hamaue | 242/374 |
| 5,553,803 A | 9/1996 | Mitzkus et al. | 242/374 |
| 5,667,161 A | 9/1997 | Mitzkus et al. | 242/374 |
| 5,811,725 A | 9/1998 | Klager | 149/19.4 |
| 5,872,329 A | 2/1999 | Burns et al. | 149/36 |
| 6,074,502 A | 6/2000 | Burns et al. | 149/36 |
| 6,210,505 B1 | 4/2001 | Khandhadia et al. | 149/36 |
| 6,306,232 B1 | 10/2001 | Khandhadia et al. | 149/22 |
| 6,419,177 B2 | 7/2002 | Stevens | 242/374 |
| 6,422,601 B1 | 7/2002 | Quioc | 280/741 |
| 6,505,790 B2 | 1/2003 | Stevens | 242/374 |
| 6,659,500 B2 | 12/2003 | Whang et al. | 280/741 |
| 6,749,219 B2 | 6/2004 | Edwards, II et al. | 280/741 |
| 6,752,421 B2 | 6/2004 | Khandhadia et al. | 280/741 |
| 7,667,045 B2 | 2/2010 | Miller et al. | 548/250 |
| 7,686,901 B2 | 3/2010 | Miller et al. | 149/46 |
| 2003/0124382 A1 | 7/2003 | Taguchi et al. | 428/690 |

FOREIGN PATENT DOCUMENTS

| | | |
|---|---|---|
| WO | WO/2005/035466 | 4/2005 |

OTHER PUBLICATIONS

Office Action U.S. Appl. No. 11/264,983, filed Nov. 1, 2005 dated for Oct. 2, 2007.

Office Action U.S. Appl. No. 11/143,198, filed Jun. 1, 2005 dated Dec. 28, 2007.

Office Action U.S. Appl. No. 11/264,983, filed Nov. 1, 2005 dated Nov. 28, 2007.

Office Action U.S. Appl. No. 11/264,983, filed Nov. 1, 2005 dated Aug. 8, 2007.

Office Action U.S. Appl. No. 11/264,983, filed Nov. 1, 2005 dated for Jul. 11, 2007.

Office Action for U.S. Appl. No. 11/143,198, filed Jun. 1, 2005 mailed Jun. 4, 2005.

Office Action for U.S. Appl. No. 11/264,982, filed Nov. 1, 2005 mailed Apr. 30, 2008.

Office Action U.S. Appl. No. 11/264,982, filed Nov. 1, 2005 mailed on Dec. 4, 2009(100) Written Opinion mailed on Oct. 20, 2009.

Office Action U.S. Appl. No. 11/264,982 Filing Date Nov. 1, 2005 mailed on Apr. 14, 2010 (100).

* cited by examiner

WATER-BASED SYNTHESIS OF POLY(TETRAZOLES) AND ARTICLES FORMED THEREFROM

CROSS-REFERENCE TO RELATED APPLICATIONS

This application claims the benefit of U.S. Provisional Application Ser. No. 60/704,397 filed on Jul. 31, 2005. This application is also a continuation-in-part of co-pending U.S. Ser. No. 11/264,982, filed Nov. 1, 2005, which is a continuation-in-part of U.S. Ser. No. 11,143,198, filed Jun. 1, 2005.

TECHNICAL FIELD

The present invention relates generally to gas generating systems, and to gas generant compositions employed in gas generator devices for automotive restraint systems, for example. A water-based method of manufacture of polyvinyl (tetrazoles) is also presented. Other articles, contemplated as replacements for known light-emitting diodes (LEDs), and liquid crystal displays (LCDs) are also provided.

BACKGROUND OF THE INVENTION

The present invention relates to nontoxic gas generating compositions that upon combustion-rapidly generate-gases that are useful for inflating occupant safety restraints in motor vehicles and specifically, the invention relates to thermally stable nonazide gas generants having not only acceptable burn rates, but that also, upon combustion, exhibit a relatively high gas volume to solid particulate ratio at acceptable flame temperatures.

The evolution from azide-based gas generants to nonazide gas generants is well-documented in the prior art. The advantages of nonazide gas generant compositions in comparison with azide gas generants have been extensively described in the patent literature, for example, U.S. Pat. Nos. 4,370,181; 4,909,549; 4,948,439; 5,084,118; 5,139,588 and 5,035,757, the discussions of which are hereby incorporated by reference.

In addition to a fuel constituent, pyrotechnic nonazide gas generants contain ingredients such as oxidizers to provide the required oxygen for rapid combustion and reduce the quantity of toxic gases generated, a catalyst to promote the conversion of toxic oxides of carbon and nitrogen to innocuous gases, and a slag forming constituent to cause the solid and liquid products formed during and immediately after combustion to agglomerate into filterable clinker-like particulates. Other optional additives, such as burning rate enhancers or ballistic modifiers and ignition aids, are used to control the ignitability and combustion properties of the gas generant.

One of the disadvantages of known nonazide gas generant compositions is the amount and physical nature of the solid residues formed during combustion. When employed in a vehicle occupant protection system, the solids produced as a result of combustion must be filtered and otherwise kept away from contact with the occupants of the vehicle. It is therefore highly desirable to develop compositions that produce a minimum of solid particulates while still providing adequate quantities of a nontoxic gas to inflate the safety device at a high rate.

The use of phase stabilized ammonium nitrate as an oxidizer, for example, is desirable because it generates abundant nontoxic gases and minimal solids upon combustion. To be useful, however, gas generants for automotive applications must be thermally stable when aged for 400 hours or more at 107 degrees C. The compositions must also retain structural integrity when cycled between −40 degrees C. and 107 degrees C. Further, gas generant compositions incorporating phase stabilized or pure ammonium nitrate sometimes exhibit poor thermal stability, and produce unacceptably high levels of toxic gases, CO and $NO_x$ for example, depending on the composition of the associated additives such as plasticizers and binders. Furthermore, recent revisions in U.S. car requirements require relatively minimal amounts of ammonia in the effluent gases.

Yet another problem that must be addressed is that the U.S. Department of Transportation (DOT) regulations require "cap testing" for gas generants. Because of the sensitivity to detonation of fuels known for their use in conjunction with ammonium nitrate, triaminoguanidine nitrate for example, many propellants incorporating ammonium nitrate do not pass the cap test unless shaped into large disks, which in turn reduces design flexibility of the inflator.

Yet another concern includes slower cold start ignitions of typical smokeless gas generant compositions, that is gas generant compositions that result in less than 10% of solid combustion products.

Yet another concern includes disposal and handling of organic compounds, solvents, and mixtures employed in the manufacture of polyvinyl(tetrazoles). The environmental impact associated with the use of organic solvents in the manufacture of polyvinyl(tetrazoles) includes related concerns of disposal, handling, and storage of these organic compounds. The flammability of many organic compounds increases the relative hazard of the manufacturing process, while the nature of the solvents requires storage and disposal in accordance with U.S.D.O.T. hazardous materials regulations.

Accordingly, ongoing efforts in the design of automotive gas generating systems, for example, include other initiatives that desirably produce more gas and less solids without the drawbacks mentioned above.

In yet another appropriate area, there has been an increasing need for versatile visual displays for electronic products of many kinds. Light-emitting diodes ("LEDs") and liquid crystal displays ("LCDs") have found many useful applications but have not been adequate in all cases. A visual display that is of relatively recent origin and that has shown much promise is the organic electroluminescent device. An electroluminescent device basically consists of an electroluminescent substance placed between a pair of electrodes. When an electric potential is applied across the electrodes, the electroluminescent substance emits visible light. Typically one of the electrodes is transparent, permitting the light to shine through.

Figures 7, 8:
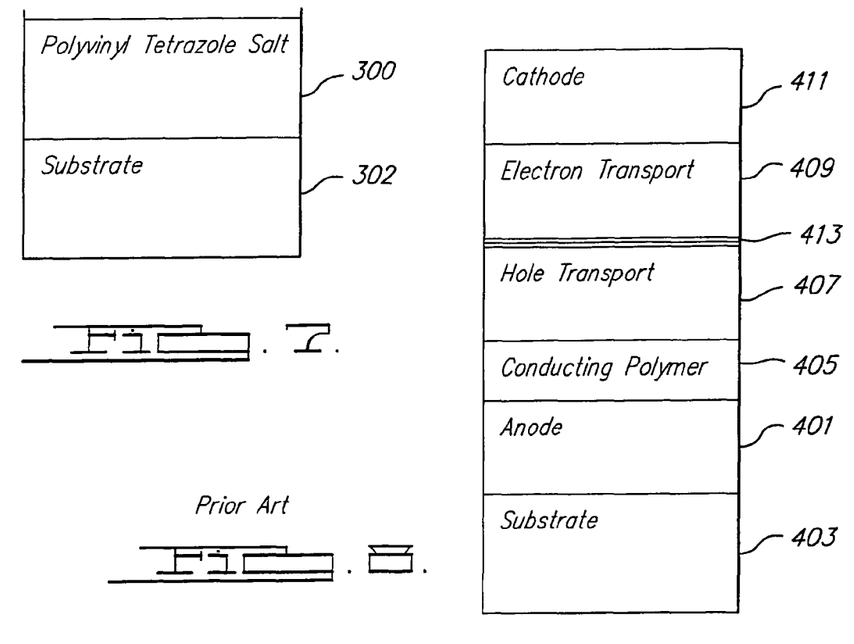
FIG. 7 is a schematic of an article containing a layer of polyvinyl salt formed in accordance with aqueous-based methods of the present invention.
FIG. 8 and FIG. 9 represent prior art LED and LCD articles.

Referring now to FIG. 8, an organic electroluminescent device known in the art includes an anode 401 on a substrate 403, a conducting polymer layer 405 adjacent the anode, a hole transport layer 407 adjacent the conducting polymer layer, an electron transport layer 409 adjacent the hole transport layer, and a cathode 411 adjacent the electron transport layer. When electric power is applied, biasing the anode positive with respect to the cathode, light is emitted at an interface 413 between the hole and electron transport layers.

Figure 9:
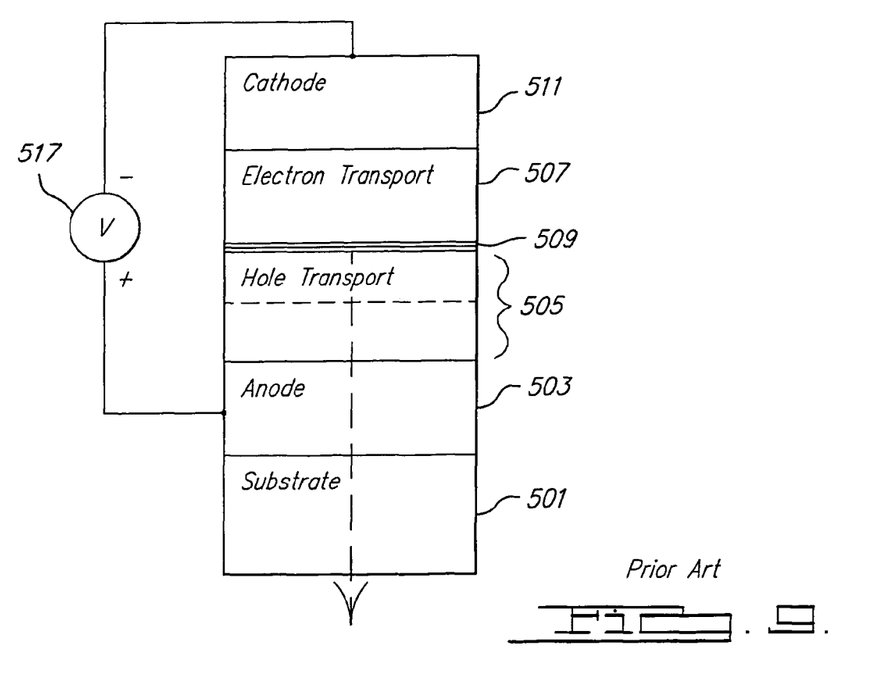

FIG. 9 illustrates another typical electroluminescent device of the kind known in the art. A glass substrate 501, measuring perhaps 15 millimeters square, is coated with a transparent anode 503. A transparent hole transport layer 505 measuring about 10 millimeters square covers the anode and an electron transport layer 507 covers the hole transport layer, forming an interface 509 between the two layers. A cathode 511 covers the electron transport layer. In some devices the hole transport layer consists of two sublayers having slightly different composition, one sublayer forming a lower region 513 adjacent the anode and the other sublayer forming an upper region 515 adjacent the electron transport layer. The thicknesses of the anode, hole transport layer, electron transport layer and cathode are each of the order of 10-500 nanometers (100-5000 .Angstroms).

In operation, electric power from a voltage source 517 is applied to the anode and the cathode, biasing the anode positive with respect to the cathode. This causes regions of positive charge ("holes") to migrate through the hole transport layer from the anode toward the electron transport layer and electrons to migrate from the cathode through the electron transport layer toward the hole transport layer. The holes and electrons combine at the interface 509 between the two layers, emitting visible light. The light propagates out of the device through the hole transport layer, the anode and the substrate as indicated by an arrow 519.

It would be a further advantage of the present invention, to simplify the manufacture of organic light emitting devices, and the complexity of the same.

SUMMARY OF THE INVENTION

The above-referenced concerns are resolved by gas generating systems including a gas generant composition containing an extrudable polyvinyltetrazole fuel. Preferred oxidizers include nonmetal oxidizers such as phase stabilized ammonium nitrate. Other oxidizers include alkali and alkaline earth metal nitrates.

The fuel is selected from the group of polyvinyltetrazoles, and mixtures thereof. An exemplary group of fuels includes polymeric tetrazoles, having functional groups on the azole pendants. Preferred vinyl tetrazoles include 5-Amino-1-vinyltetrazole and poly(5-vinyltetrazole), both exhibiting self-propagating thermolysis or thermal decomposition. Other fuels include poly(2-methyl-5-vinyl)tetrazole and poly(1-vinyl)tetrazole. These and other possible fuels are structurally illustrated in the figures included herewith. As such, the polyvinyltetrazoles may exhibit pendant aromaticity, or, aromatic character within the polymer backbone, depending on the design criteria of the gas generant composition, and depending on the starting reagents in the synthesis of the polyvinyltetrazole. In certain embodiments, the fuel constitutes about 10-40% by weight of the gas generant composition.

An oxidizer is preferably selected from the group of nonmetal, and alkali and alkaline earth metal nitrates, and mixtures thereof. Nonmetal nitrates include ammonium nitrate and phase stabilized ammonium nitrate, stabilized as known in the art. Alkali and alkaline earth metal nitrates include potassium nitrate and strontium nitrate. Other oxidizers known for their utility in air bag gas generating compositions are also contemplated. In certain embodiments, the oxidizer constitutes about 60-90% by weight of the gas generant composition.

Other gas generant constituents known for their utility within vehicle occupant protection systems, and within gas generant compositions typically contained therein, may be employed in functionally effective amounts in the compositions of the present invention. These include, but are not limited to, coolants, slag formers, and ballistic modifiers known in the art.

A water-based process has been developed in which a nitrile-containing pre-polymer is first converted into a polymer-bound zinc tetrazole organometallic complex by reacting the pre-polymer with a divalent zinc halide in the presence of an azide and a surfactant, the reactants under pressure at high temperature. The resulting polymer intermediate once filtered, and washed from the reaction media, may then be converted into the corresponding tetrazole salt by treatment with a concentrated acid. The polyvinyl(tetrazole) acid may then be converted into a water-soluble salt by reacting the acid with a suitable base.

In sum, the present invention includes gas generant compositions that maximize gas combustion products and minimize solid combustion products while retaining other design requirements such as thermal stability. An article formed from a coating of the water-soluble salt is also provided and further described below. These and other advantages will be apparent upon a review of the detailed description.

BRIEF DESCRIPTION OF THE DRAWINGS

FIG. 5 and FIG. 6 are graphical representations indicating combustion profiles of the same gas generant before and after aging for 400 hours at 107 C.

DETAILED DESCRIPTION OF THE PREFERRED EMBODIMENT(S)

The present invention generally relates to gas generant compositions for inflators of occupant restraint systems. In accordance with the present invention, a pyrotechnic composition includes poly(tetrazoles) or extrudable fuels such as polyvinyltetrazoles (PVT) for use within a gas generating system, such as that exemplified by a high gas yield automotive airbag propellant in a vehicle occupant protection system. Poly(tetrazole) may be defined as any compound or molecule that contains more than one tetrazole ring. The fuel also functions as a binder. Preferred oxidizers include nonmetal oxidizers such as ammonium nitrate and ammonium perchlorate. Other oxidizers include alkali and alkaline earth metal nitrates.

The fuel is selected from the group of poly(tetrazoles) or polyvinyltetrazoles, and mixtures thereof. An exemplary group of fuels includes polymeric tetrazoles having functional groups on the azole pendants. Vinyl tetrazoles include 5-Amino-1-vinyltetrazole and poly(5-vinyltetrazole), both exhibiting self-propagating thermolysis or thermal decomposition. Other fuels include poly(2-methyl-5-vinyl)tetrazole, and poly(1-vinyl)tetrazole. Depending on the pre-polymer chosen for the reaction, these and other possible poly(tetrazole) salts/fuels are exemplified by, but not limited to, the structures shown below.

Poly(5-vinyl) tetrazole    Poly(1-vinyl) tetrazole

Poly(5-amino-1-vinyl) tetrazole    Poly(2-methyl-5-vinyl) tetrazole

It has been discovered that an unexpected additional benefit with the inclusion of the present fuels is that compositions resulting in difficult cold-start ignitions that necessitate more powerful ignition trains and boosters, are avoided. Poly(5-amino-1-vinyl)tetrazole, for example, is believed to have no endothermic process before exothermic decomposition begins. Therefore, the heat-consuming step normally attendant prior to the energy releasing steps of combustion (that acts as an energy barrier), is apparently not present in the present compositions. It is believed that other polymeric azoles functioning as fuels in the present invention have the same benefit. In certain embodiments, the polyvinylazole fuel constitutes about 5-40% by weight of the gas generant composition.

An oxidizer is preferably selected from the group of nonmetal, and alkali and alkaline earth metal nitrates, and mixtures thereof. Nonmetal nitrates include phase stabilized ammonium nitrate, stabilized as known in the art for example. Alkali and alkaline earth metal nitrates include potassium nitrate and strontium nitrate. It has been found that in accordance with the present invention, compositions containing phase stabilized ammonium nitrate exhibit sufficient thermal stability, in contrast to many other known compositions containing unstabilized ammonium nitrate and/or phase stabilized ammonium nitrate. Other oxidizers known for their utility in air bag gas generating compositions are also contemplated. It must be appreciated, however, that the oxidizers of the present invention provide an overall oxygen balance within the combustion reaction to minimize the production of carbon monoxide and/or nitrogen oxides. The oxygen balance provided in accordance with the present invention will be −4.0% to +4.0% as provided by the oxidizer(s). It will be appreciated that in gun propellants for example, the amount of oxygen balance purposefully results in carbon monoxide upon combustion of the respective gun propellant thereby providing the required thrust with the lowest possible molecular weight gases. In certain embodiments, the oxidizer constitutes about 60-95% by weight of the gas generant composition.

Other gas generant constituents known for their utility in air bag gas generant compositions may be employed in functionally effective amounts in the compositions of the present invention. These include, but are not limited to, coolants, slag formers, and ballistic modifiers known in the art.

The gas generant constituents of the present invention are supplied by suppliers known in the art and are preferably blended by a wet method. Typical or known suppliers include Aldrich or Fisher Chemical companies. A solvent chosen with regard to the group(s) substituted on the polymeric fuel is heated to a temperature sufficient to dissolve the fuel but below boiling, for example just below 100° C., but low enough to prevent autoignition of any of the constituents as they are added and then later precipitate. Hydrophilic groups, for example, may be more efficiently dissolved by the use of water as a solvent. Other groups may be more efficiently dissolved in an acidic solution, nitric acid for example. Other solvents include alcohols and plasticizers such as polyethylene glycol. Once a suitable solvent is chosen and heated, the fuel is slowly added and dissolved. The oxidizer is then slowly added and also dissolved. Any other desirable constituents are likewise dissolved. The solution is heated and continually stirred. As the solvent is cooked off over time, the fuel and oxidizer, and any other constituents, are co-precipitated in a homogeneous solid solution. The precipitate is removed from the heat once the solvent has been at least substantially volatilized, but more preferably completely volatilized. The composition may then be extruded into pellets or any other useful shape. More preferably, a gas generant composition of the present invention will contain a polyvinyl (tetrazole) and phase stabilized ammonium nitrate. The advantages are high gas yield and low solids production, a high energy fuel/binder, and a low-cost oxidizer thereby obviating the need for filtration of the gas given that little if any solids are produced upon combustion. The compositions of the present invention may be extruded given the pliant nature of the polymeric fuels.

The gas generant compositions of the present invention may also contain a secondary fuel formed from amine salts of tetrazoles and triazoles. These are described and exemplified in co-owned U.S. Pat. Nos. 5,872,329, 6,074,502, 6,210,505, and 6,306,232, each herein incorporated by reference. The total weight percent of both the first and second fuels, or the fuel component of the present compositions, is about 5 to 40 weight % of the total gas generant composition. As shown in the data presented in FIGS. 3 and 4, the use of a secondary fuel provides enhanced burn rates as pressure increases.

More specifically, nonmetal salts of tetrazoles and triazoles include in particular, amine, amino, and amide salts of tetrazole and triazole selected from the group including monoguanidinium salt of 5,5'-Bis-1H-tetrazole (BHT.1GAD), diguanidinium salt of 5,5'-Bis-1H-tetrazole (BHT.2GAD), monoaminoguanidinium salt of 5,5'-Bis-1H-tetrazole (BHT.1AGAD), diaminoguanidinium salt of 5,5'-Bis-1H-tetrazole (BHT.2AGAD), monohydrazinium salt of 5,5'-Bis-1H-tetrazole (BHT.1HH), dihydrazinium salt of 5,5'-Bis-1H-tetrazole (BHT.2HH), monoammonium salt of 5,5'-bis-1H-tetrazole (BHT.1NH$_3$), diammonium salt of 5,5'-bis-1H-tetrazole (BHT.2NH$_3$), mono-3-amino-1,2,4-triazolium salt of 5,5'-bis-1H-tetrazole (BHT.1ATAZ), di-3-amino-1,2,4-triazolium salt of 5,5'-bis-1H-tetrazole (BHT.2ATAZ), and diguanidinium salt of 5,5'-Azobis-1H-tetrazole (ABHT.2GAD).

Amine salts of triazoles include monoammonium salt of 3-nitro-1,2,4-triazole (NTA.1NH$_3$), monoguanidinium salt of 3-nitro-1,2,4-triazole (NTA.1GAD), diammonium salt of dinitrobitriazole (DNBTR.2NH$_3$), diguanidinium salt of dinitrobitriazole (DNBTR.2GAD), and monoammonium salt of 3,5-dinitro-1,2,4-triazole (DNTR.1NH$_3$).

Formula I

Formula II

A generic nonmetal salt of tetrazole as shown in Formula I includes a cationic nitrogen containing component, Z, and an anionic component comprising a tetrazole ring and an R group substituted on the 5-position of the tetrazole ring. A generic nonmetal salt of triazole as shown in Formula II includes a cationic nitrogen containing component, Z, and an anionic component comprising a triazole ring and two R groups substituted on the 3- and 5-positions of the triazole ring, wherein $R_1$ may or may not be structurally synonymous with $R_2$. An R component is selected from a group including hydrogen or any nitrogen-containing compound such as an amino, nitro, nitramino, or a tetrazolyl or triazolyl group as shown in Formula I or II, respectively, substituted directly or via amine, diazo, or triazo groups. The compound Z is substituted at the 1-position of either formula, and is formed from a member of the group comprising amines, aminos, and amides including ammonia, carbohydrazide, oxamic hydrazide, and hydrazine; guanidine compounds such as guanidine, aminoguanidine, diaminoguanidine, triaminoguanidine, dicyandiamide and nitroguanidine; nitrogen substituted carbonyl compounds or amides such as urea, oxamide, bis-(carbonamide)amine, azodicarbonamide, and hydrazodicarbonamide; and, amino azoles such as 3-amino-1,2,4-triazole, 3-amino-5-nitro-1,2,4-triazole, 5-aminotetrazole, 3-nitramino-1,2,4-triazole, 5-nitraminotetrazole, and melamine.

Example 1

The reaction given below exemplifies the water-based reaction and formation of a poly(tetrazole) of the present invention.

-continued

As shown in the reaction, a nitrile-containing pre-polymer is first converted into a polymer-bound zinc tetrazole organometallic complex by reacting the pre-polymer with a divalent zinc halide (chlorine, bromine, or fluorine, for example) in the presence of an azide along with a surfactant under pressure at high temperature. Zinc bromide, sodium azide, and ammonium lauryl sulfate are employed as the zinc halide, the azide salt, and the surfactant respectively. The reaction time is about 24 hours at about 170 degrees C. The polymer intermediate is then filtered and washed to rinse off the reaction media. The washed polymer intermediate is then treated with concentrated acid (HCl for example). The poly(tetrazole) acid is then treated with a base to convert the acid into a water-soluble salt. All steps in the process are carried out in water, in contrast to the typical organic solvents often employed. The percent yield of the nitrile pre-polymer converted to a poly(tetrazole) is about 95%.

Example 2

A poly(tetrazole) is formed in the same manner and in the same molar ratios as given in Example 1, and as shown in the reaction therein. A nitrile-containing pre-polymer is first converted into a polymer-bound zinc tetrazole organometallic complex by reacting the pre-polymer with a divalent zinc halide in the presence of an azide along with a surfactant under pressure at high temperature. Zinc bromide, sodium azide, and ammonium lauryl sulfate are employed as the zinc halide, the azide salt, and the surfactant respectively. The reaction time is about 16 hours at about 150 degrees C. The polymer intermediate is then filtered and washed to rinse off the reaction media. The washed polymer intermediate is then treated with concentrated acid (HCl for example). The poly(tetrazole) acid is then treated with a base to convert the acid into a water-soluble salt. All steps in the process are carried out in water, in contrast to the typical organic solvents often employed. The percent yield of the nitrile pre-polymer converted to a poly(tetrazole) is about 90-95%.

Example 3

A poly(tetrazole) is formed in the same manner and same molar ratios as given in Example 1, and as shown in the reaction therein. A nitrile-containing pre-polymer is first converted into a polymer-bound zinc tetrazole organometallic complex by reacting the pre-polymer with a divalent zinc halide in the presence of an azide along with a surfactant under pressure at high temperature. Zinc bromide, sodium azide, and ammonium lauryl sulfate are employed as the zinc halide, the azide salt, and the surfactant respectively. The reaction time is about 16 hours at about 115 degrees C. The polymer intermediate is then filtered and washed to rinse off the reaction media. The washed polymer intermediate is then treated with concentrated acid (HCl for example). The poly(tetrazole) acid is then treated with a base to convert the acid into a water-soluble salt. All steps in the process are carried out in water, in contrast to the typical organic solvents often employed. The percent yield of the nitrile pre-polymer converted to a poly(tetrazole) is about 70%.

Examples 4-9

Examples 4-9 are tabulated below and provide a comparative view of the different types and amounts of gas produced with regard to several known gas generant compositions and a gas generant formed in accordance with the present invention. Example 4 is a representative gas generant composition formed from 5-aminotetrazole and strontium nitrate, in accordance with U.S. Pat. No. 5,035,757 herein incorporated by reference. Example 5 is a representative gas generant composition formed from an amine salt of tetrazole such as diammonium salt of 5,5'-bi-1H-tetrazole, phase stabilized ammonium nitrate, strontium nitrate, and clay in accordance with U.S. Pat. No. 6,210,505 herein incorporated by reference. Example 6 is a representative gas generant composition formed from an amine salt of tetrazole such as diammonium salt of 5,5'-bi-1H-tetrazole and phase stabilized ammonium nitrate in accordance with U.S. Pat. No. 5,872,329 herein incorporated by reference. Example 7 is a representative gas generant composition formed from ammonium nitramine tetrazole and phase stabilized ammonium nitrate in accordance with U.S. Pat. No. 5,872,329 herein incorporated by reference. Example 8 is a representative gas generant composition formed from ammonium nitramine tetrazole, phase stabilized ammonium nitrate, and a slag former in accordance with U.S. Pat. No. 5,872,329 herein incorporated by reference. Example 9 is a representative composition formed in accordance with the present invention containing ammonium polyvinyl tetrazole and phase stabilized ammonium nitrate (ammonium nitrate coprecipitated with 10% potassium nitrate).

Table 1 details the relative amounts produced (ppm) of carbon monoxide (CO), ammonia (NH3), nitrogen monoxide (NO), and nitrogen dioxide (NO2) with regard to each example and the amount of gas generant in grams (g). All examples were combusted in a gas generator of substantially the same design.

TABLE 1

| Example | g | $P_c$ | CO | NH3 | NO | NO2 |
|---------|---|-------|-----|-----|-----|-----|
| 4 | 45 | 15 | 125 | 10 | 49 | 9 |
| 5 | 25 | 36 | 109 | 65 | 29 | 4 |
| 6 | 25 | 29 | 111 | 29 | 37 | 5 |
| 7 | 25 | 36 | 62 | 10 | 28 | 3 |
| 8 | 25 | 37 | 98 | 35 | 33 | 4 |
| 9 | 25 | 34 | 129 | 4 | 28 | 4 |

The data collected indicates that the composition of Example 9, formed in accordance with the present invention, results in far less ammonia than the other examples, well below the industry standard of 35 ppm. It has been discovered that compositions of the present invention result in substantially less amounts of ammonia as compared to other known gas generants. In certain known gas generant-compositions, it is often difficult to reduce the total amount of ammonia produced upon combustion, even though other performance criteria remain favorable.

Examples 10-14

Theoretical examples 10-14 are tabulated below and provide a comparative view of the different amounts and types of gas produced with regard to several gas generant compositions formed in accordance with the present invention. All phase stabilized ammonium nitrate (PSAN10) referred to in Table 2 has been stabilized with 10% by weight potassium nitrate of the total PSAN. All examples employ ammonium poly(C-vinyltetrazole) (APV) as the primary fuel. Certain examples employ nonmetal diammonium salt of 5,5'-Bis-1H-tetrazole (BHT.2NH3) as a secondary fuel. All examples reflect results generated by combustion of the gas generant constituents (propellant composition) within a similarly designed inflator or gas generator with equivalent heat sink design.

TABLE 2

| Ex. | Constituents (wt % of 100 g) | | Flame Temp. (K) | Exhaust Temp. (K) | Gas Combustion Products (mol) |
|-----|------|------|------|------|------|
| 10 | 15% | APV | 2222 | 857 | 2.25 H2O |
|    | 85% | PSAN10 | | | 1.33 N2 |
|    |     |        | | | 0.39 CO2 |
| 11 | 16% | APV | 2039 | 890 | 2.00 H2O |
|    | 69% | PSAN10 | | | 1.2 N2 |
|    | 10% | Strontium Nitrate | | | 0.37 CO2 |
|    | 5%  | Clay | | | |
| 12 | 22% | APV | 2054 | 1225 | 0.64 H2O |
|    | 73% | Strontium Nitrate | | | 0.83 N2 |
|    | 05% | Clay | | | 0.52 CO2 |
| 13 | 08% | APV | 2036 | 874 | 1.86 H2O |
|    | 64.60% | PSAN10 | | | 1.34 N2 |
|    | 10% | Strontium Nitrate | | | 0.35 CO2 |
|    | 05% | Clay | | | |
|    | 12.40% | BHT.2NH3 | | | |
| 14 | 08% | APV | 2206 | 835 | 2.20 H2O |
|    | 80.60% | PSAN10 | | | 1.45 N2 |
|    | 11.40% | BHT.2NH3 | | | 0.34 CO2 |

Example 10 has been found to be thermally stable at 107 degrees Celsius for 400 hours with only a 0.5% mass loss. Accordingly, Example 10 exemplifies the unexpected thermal stability of gas generant compositions of the present invention, particularly those incorporating a polyvinyltetrazole as defined herein and phase stabilized ammonium nitrate (stabilized with 10% potassium nitrate). It should be emphasized that other phase stabilizers are also contemplated as known or recognized in the art.

Examples 11 through 13 exemplify the use of a polyvinyltetrazole with metallic oxidizers. In certain applications, the use of a metallic oxidizer may be desired for optimization of ignitability, burn rate exponent, gas generant burn rate, and other design criteria. The examples illustrate that the more metallic oxidizer is used the less mols of gas produced upon combustion.

In contrast, Examples 10 and 14 illustrate that molar amounts of gas combustion products are maximized when nonmetal gas generant constituents are employed. Accordingly, preferred gas generant compositions of the present invention contain at least one polyvinyl(tetrazole) as a fuel component and a nonmetal oxidizer as an oxidizer component.

Figure 3:
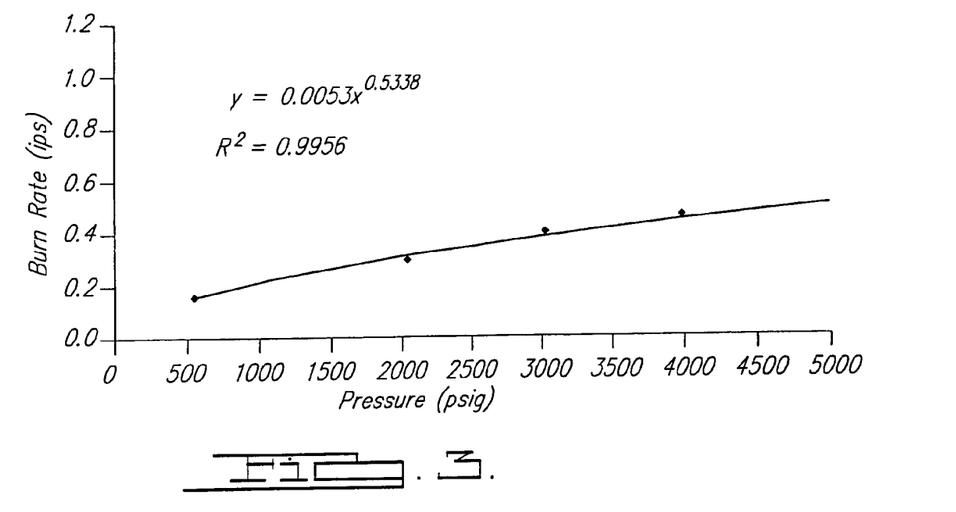
FIG. 3 and FIG. 4 are graphical representations of respective burn rates compared to combustion pressure of gas generant compositions.
Figure 4:
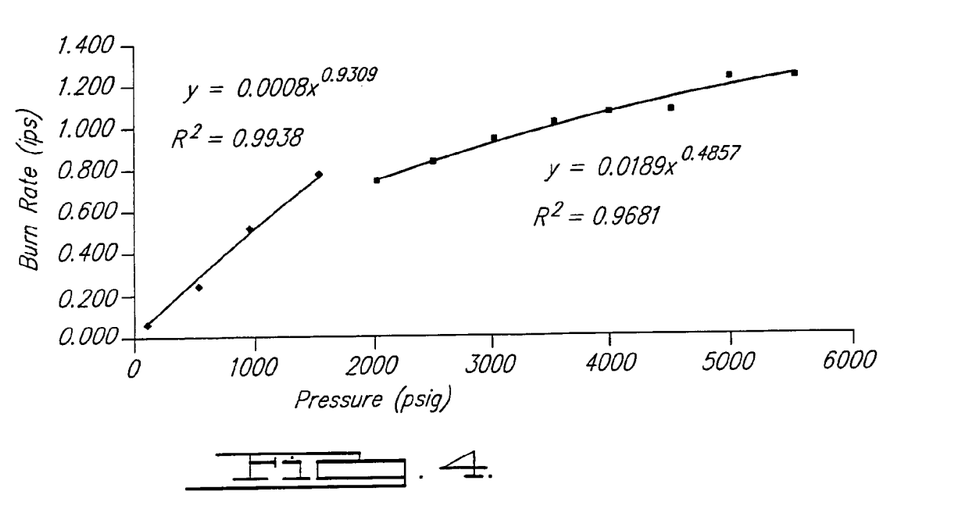

Finally, with regard to Example 14, it has been found that the gas generant burn rate may be enhanced by adding another nonmetal fuel, BHT.2NH3, to APV and PSAN10, thereby optimizing the combustion profile of the gas generant composition. The burn rate of Example 14 is recorded at 1.2 inches per second at 5500 psi. It can be concluded therefore, that the addition of nonmetal amine salts of tetrazoles and/or nonmetal amine salts of triazoles as described in U.S. Pat. No. 5,872,329 may be advantageous with regard to burn rate and gas generation. Furthermore, the pliant nature of the APV provides extrudability of the propellant composition. As shown in FIGS. 3 and 4, the addition of a secondary fuel as indicated above, results in enhanced burn rates as the combustion pressure is elevated. FIG. 3 illustrates the burn rates over pressure of a formulation containing only polyvinyltetrazole and phase stabilized ammonium nitrate. In contrast, FIG. 4 illustrates the burn rates over pressure of a similar composition of FIG. 3 containing polyvinyltetrazole and phase stabilized ammonium nitrate, but with the addition of di-ammonium BHT, in accordance with the percent weight ranges provided herein. It can be concluded that the addition of a secondary fuel as described herein results in a significant advantage with regard to burn rate. The practical effect is repeatability of performance and enhanced ballistic properties of gas generants formed accordingly.

Examples 15 and 16

Examples 15 and 16 exemplify the cold start advantage of gas generant compositions containing a polyvinyltetrazole. As indicated by differential scanning calorimetry (DSC), typical smokeless or nonmetal compositions may exhibit an endothermic trend prior to exothermic combustion. As a result, relatively greater amounts of energy must be available to ignite the gas generant and sustain combustion of the same. Oftentimes, a more aggressive ignition train, to include an aggressive booster composition perhaps, is required to attain the energy level necessary to ignite the gas generant and sustain combustion. Example 15 pertains to a composition containing 65% PSAN10 and about 35% BHT.2NH3. As indicated by DSC testing, an endotherm is maximized at 253.12 degrees Celsius, thereby representing a recorded loss of about 508.30 joules/gram of gas generant. In comparison, Example 16 pertains to a composition containing about 15% poly(C-vinyltetrazole) and about 85% PSAN10. Most unexpectedly, there is no endothermic process as indicated by DSC and accordingly, combustion proceeds in an uninhibited manner. As a result, less energy is required to combust the gas generant composition thereby reducing the ignition train or ignition and booster requirements.

Example 17

Another advantage of the present invention is illustrated in FIGS. 5 and 6. FIG. 5 illustrates baseline, or pre-aged combustion of a gas generating composition made in accordance with the present invention, within a state-of-the-art gas generator. Specifically, the gas generating composition contained 80.6% PSAN, 8.0% PVT, and 11.4% BHT.2NH3. FIG. 6, on the other hand, illustrates post-aged combustion of the same gas generating composition within the same gas generator. The curves indicated in FIGS. 5 and 6 correlate to "hot" or +85 C, "ambient" or 23 C, and "cold" or –40 C deployments of standard driver side inflators within a 60 liter ballistics tank. As shown, there is an insignificant combustion profile difference between the operation of the pre-aged and post-aged gas generants, when deployed at the three various temperatures. It will be appreciated that USCAR specifications for "accelerated aging" are 400 hours at 107 C. Typically, many car manufacturers worldwide require similar accelerated aging criteria.

Examples 18-21

Examples 18-21 are further illustrations of how, in accordance with the present invention, the selection of a cyano- or nitrile-containing pre-polymer is determinative of what end-product results. Accordingly, it can be seen that the appropriate selection of nitrile-containing pre-polymers will produce the desired poly(tetrazole) as an end product.

Example 18

Example 19

Example 20

Example 21

In yet another aspect of the invention, it has been unexpectedly discovered that the polyvinyl tetrazole salts formed as described in the present invention result in salts having luminescent properties. Unlike similar salts formed utilizing organic solvents, the present salts provide a luminescent character not heretofore shown. It will be appreciated that the polyvinyl tetrazole salts formed by the aqueous method of the present invention impart a luminescent quality to the resultant salts. Accordingly, the character of the salts may be distinguished from salts produced with organic solvents.

Accordingly, articles formed from the salts resulting from the manufacturing method include any glass, polymeric, or other substrate wherein a luminescent quality is desired. Deposition of the salts may be provided by spin casting the salts as suspended in aqueous solution onto an indium-tin oxide (ITO) anode coating on a glass substrate, for example. U.S. Pat. No. 5,719,467, incorporated herein by reference in its entirety, describes spin-cast deposition of polyanilin onto an ITO anode thereby producing an organic luminescent device. It is contemplated that supplanting polyanilin with the salts of the present invention provides an alternative way to provide an organic luminescent device. It is believed that the use of the polyvinyl salts of the present invention make removal of additional layers such as anode, conducting polymer, hole transport, electron transport and cathode layers unnecessary when luminescent quality is desired. Other uses are also contemplated. A schematic of an organic electroluminescent article formed in accordance with known spin casting techniques (described below) and in accordance with known deposition processes is shown in FIGS. 8 and 9. In contrast, a substrate containing only the salts of the present invention is shown in FIG. 7 whereby luminescent quality is still provided. Advantages are apparent in that the manufacturing process is simplified by removing layers otherwise required when utilizing organic electroluminescent technology, for example. Furthermore, any applicable power supply is not required to maintain luminescent quality as known in other prior art configurations, as shown in FIG. 9 for example.

Spin casting techniques and equipment are well known and are exemplified by U.S. Pat. Nos. 4,519,971, 4,517,140, 3,695,911, 4,637,791, 4,659,522, and 4,637,791, herein incorporated by reference in their entirety.

As shown in FIG. 7, a coating 300, formed in accordance with the present invention, is deposited over a substrate 302 such as glass. The solution provided in step 4 of the method of manufacture, or the salt suspended in aqueous solution, is spin cast over a glass substrate and essentially air dried. It is contemplated that the type of salt, for example the cation resulting from the base chosen, will be determinative of the luminescent or fluorescent quality of the salt. It will be appreciated that modification of various reaction conditions or reactants may be altered to iteratively determine the intensity of the luminescence in the resulting salt. Microscopic slides, ocular lenses, or other glass products are exemplified, but in no way limit the breadth of application of the luminescent salts. It will be seen that other layers typically utilized to illuminate the substrate 302 platform are not necessary for luminescent quality, although they may be provided if desired.

Figure 2:
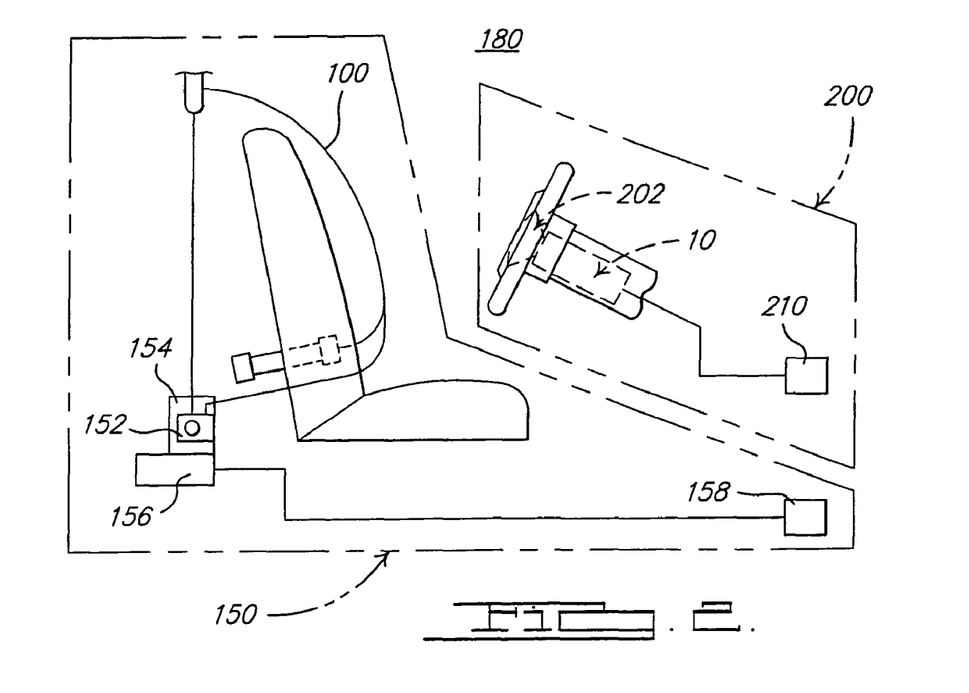
FIG. 2 is a schematic representation of an exemplary vehicle occupant restraint system containing a gas generant composition in accordance with the present invention.

In yet another aspect of the invention, the present compositions may be employed within a gas generating system. For example, as schematically shown in FIG. 2, a vehicle occupant protection system made in a known way contains crash sensors in electrical communication with an airbag inflator in the steering wheel, and also with a seatbelt assembly. The gas generating compositions of the present invention may be employed in both subassemblies within the broader vehicle occupant protection system or gas generating system. More specifically, each gas generator employed in the automotive gas generating system may contain a gas generating composition as described herein.

The compositions may be dry or wet mixed using methods known in the art. The various constituents are generally provided in particulate form and mixed to form a uniform mixture with the other gas generant constituents. The mixture is then palletized or formed into other useful shapes in a safe manner known in the art. Preferred gas generant compositions include 60-95% by weight of phase-stabilized ammonium nitrate (10-15% KNO3) and 5-40% by weight of a nonmetal poly(c-vinyltetrazole). A preferred gas generant composition includes 85% by weight of phase-stabilized ammonium nitrate and 15% by weight of ammonium poly(c-vinyltetrazole). An even more preferred gas generant composition includes about 8% ammonium poly(c-vinyltetrazole), about 11% diammonium salt of 5,5'-bis-1H-tetrazole, and about 81% phase-stabilized ammonium nitrate.

It should be noted that all percents given herein are weight percents based on the total weight of the gas generant composition. The chemicals described herein may be supplied by companies such as Aldrich Chemical Company and Polysciences, Inc. for example.

Figure 1:
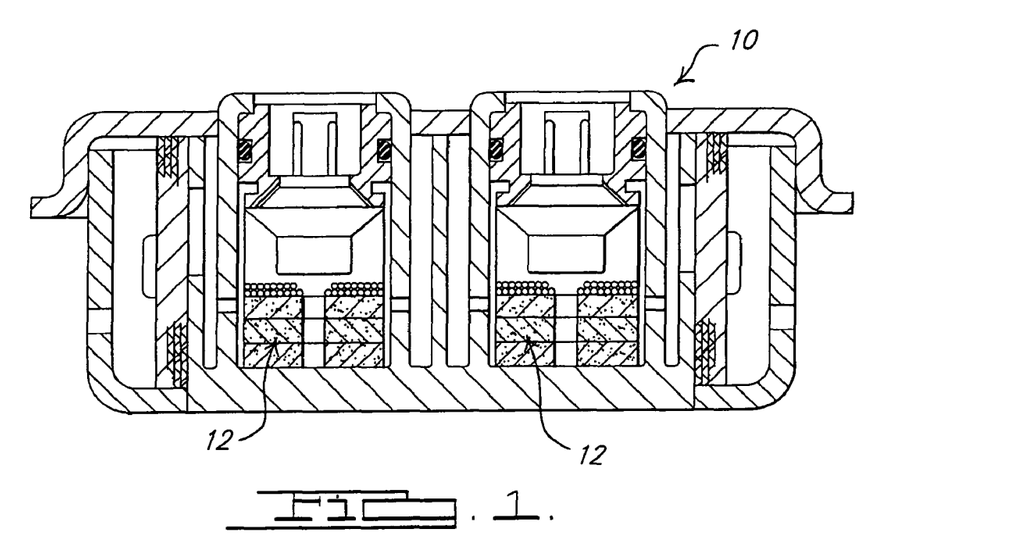
FIG. 1 is a cross-sectional side view showing the general structure of an inflator in accordance with the present invention.

As shown in FIG. 1, an exemplary inflator incorporates a dual chamber design to tailor the force of deployment an associated airbag. In general, an inflator containing a primary gas generant 12 and an autoignition composition 14 formed as described herein, may be manufactured as known in the art. U.S. Pat. Nos. 6,422,601, 6,805,377, 6,659,500, 6,749,219, and 6,752,421 exemplify typical airbag inflator designs and are each incorporated herein by reference in their entirety.

Referring now to FIG. 2, the exemplary inflator 10 described above may also be incorporated into an airbag system 200. Airbag system 200 includes at least one airbag 202 and an inflator 10 containing a gas generant composition 12 in accordance with the present invention, coupled to airbag 202 so as to enable fluid communication with an interior of the airbag. Airbag system 200 may also include (or be in communication with) a crash event sensor 210. Crash event sensor 210 includes a known crash sensor algorithm that signals actuation of airbag system 200 via, for example, activation of airbag inflator 10 in the event of a collision.

Referring again to FIG. 2, airbag system 200 may also be incorporated into a broader, more comprehensive vehicle occupant restraint system 180 including additional elements such as a safety belt assembly 150. FIG. 2 shows a schematic diagram of one exemplary embodiment of such a restraint system. Safety belt assembly 150 includes a safety belt housing 152 and a safety belt 100 extending from housing 152. A safety belt retractor mechanism 154 (for example, a spring-loaded mechanism) may be coupled to an end portion of the belt. In addition, a safety belt pretensioner 156 containing propellant 12 and autoignition 14 may be coupled to belt retractor mechanism 154 to actuate the retractor mechanism in the event of a collision. Typical seat belt retractor mechanisms which may be used in conjunction with the safety belt embodiments of the present invention are described in U.S. Pat. Nos. 5,743,480, 5,553,803, 5,667,161, 5,451,008, 4,558,832 and 4,597,546, incorporated herein by reference. Illustrative examples of typical pretensioners with which the safety belt embodiments of the present invention may be combined are described in U.S. Pat. Nos. 6,505,790 and 6,419,177, incorporated herein by reference.

Safety belt assembly 150 may also include (or be in communication with) a crash event sensor 158 (for example, an inertia sensor or an accelerometer) including a known crash sensor algorithm that signals actuation of belt pretensioner 156 via, for example, activation of a pyrotechnic igniter (not shown) incorporated into the pretensioner. U.S. Pat. Nos. 6,505,790 and 6,419,177, previously incorporated herein by reference, provide illustrative examples of pretensioners actuated in such a manner.

It should be appreciated that safety belt assembly 150, airbag system 200, and more broadly, vehicle occupant protection system 180 exemplify but do not limit gas generating systems contemplated in accordance with the present invention.

Method of Manufacture

As exemplified in Examples 1-3, and as also exemplified in Examples 18-21, the fuels of the present invention may be formed by a water-based method for synthesizing polyvinyltetrazoles as provided below. A water-based process contains the following steps. First, a pre-polymer containing a pendant nitrile or cyano group is provided. Any pre-polymer within cyano or nitrile functionality could be used in the synthesis. Examples include poly(cyanoacrylates), poly(haloacylonitriles) where the halogen can be fluorine, chlorine, bromine, or iodide, poly(crotonitriles), poly(triallyl cyanurates), cellulose cyanoethyl ethers, and poly(methacrylonitriles). Certain copolymers or block copolymers containing nitrile functionality are also contemplated for use as a pre-polymer. These copolymers include poly(butadiene/acrylonitrile)s and poly(styrene/acrylonitrile)s, as well as any other polymer blends of any nitrile containing polymer or oligomer. These polymers and copolymers may be purchased from known manufacturers such as Polysciences, Inc. (www.polysciences.com). A preferred polymeric backbone is a polyethylene chain, although any useful backbone may be employed. The nitrile cannot be part of the backbone and must always be a pendant group. Furthermore, the material may be classified as a pendant-nitrile containing pre-polymer. The pre-polymer may exhibit aromatic character.

The pre-polymer is then reacted with a divalent zinc halide, $ZnX_2$, in the presence of an azide such as sodium azide, water, and a surfactant, all under pressure at high temperature to form a polymer-bound zinc tetrazole organometallic complex. The polymer intermediate complex is then filtered and washed from the reaction media and then converted to a corresponding tetrazole acid by treatment with concentrated acid. The poly(tetrazole) acid can then be converted into a water soluble salt by reacting it with a suitable base. All steps in the process are carried out in water.

The azide can be any metallic azide such as sodium azide, for example. The surfactant can be essentially any useful surfactant. One exemplary surfactant is ammonium lauryl sulfate, provided by Rhodia, Inc. Other surfactants include various soaps or detergents (e.g. Dial®), phase transfer catalysts such as quaternary ammonium salts (such as tetrabutyl ammonium bromide from Aldrich Chemical Company). The zinc halide can be zinc chloride, zinc bromide, or zinc iodide. The concentrated acid can be hydrogen chloride, hydrogen bromide, nitric acid, sulfuric acid, and organic acids such as acetic acid. Preferably, any acid may be employed that results in a polymer suspension solution having a pH of about 1-3. These acids are available from Aldrich Chemical Company, for example. The base(s) employed may be selected from the group including ammonium hydroxide, hydroxylamine, hydrazine, and any other suitable amine with a pKb compatible to form a stable salt with the polymer. These bases are available from Aldrich Chemical Company, for example.

Process conditions may be described as follows: a 1.0 molar equivalent of polyacrylonitrile (exemplary pre-polymer, Polysciences, Inc.) is reacted with 0.5 molar equivalents of zinc bromide dihydrate (Aldrich), 1.1 equivalents of sodium azide (Aldrich), and 0.0025 molar equivalents of ammonium lauryl sulfate as a 28% wt % solution in water (Rhodia). The final molarity based on the amount of polymer in the water is about 1.0. An exemplary batch uses 47.7 grams pre-polymer, 64.29 grams azide, 117.41 grams zinc, and 2.25 ml surfactant, all constituents mixed in 900 ml of water. The ratios may vary as long as an excess of azide is present and at least 0.5 equivalents of zinc are present. The amount of surfactant may also be varied ranging from no more than 0.1 equivalents and no less than 0.000001 equivalents. The amount of water may vary between a 5.0 molar solution and a 0.1 molar solution. The reagents are mixed in the pressure reactor wherein the order of the addition of the reagents to the pressure reactor may be varied. Upon addition of all of the reagents, the pressure reactor is sealed. The contents are stirred and heated to 170 degrees Celsius which will reach a pressure of between 80-100 psi. The mixture is then left to react for a period of about 24-48 hours (preferably 24 hours) and then cooled to room temperature. The milky contents are preferably then filtered in a buchner funnel and washed with an equal volume of water.

Next, the contents are dispersed in about 1.0 to 10.0 liters, and more preferably 3.0 liters, of cold water (ranging from 0-24 degrees Celsius) and rapidly stirred. Enough acid is added to make the pH of the suspension between 1-3 and the mixture is continually stirred for about twenty minutes. The suspension is then filtered again in a buchner funnel using a nylon screen and washed with an equivalent amount of water. This leaves a rubbery wet material in the funnel which is removed and cut into small pieces using standard scissors. This material is then suspended in 1.0 liter of water and excess ammonium hydroxide (Aldrich) is added as the suspension stirs (at least one molar equivalent of ammonium hydroxide is preferably used, and more may be used if desired).

The suspension will slowly dissolve, but heat can be applied to quicken the process, wherein the temperature may range from about 25-100 degrees Celsius. The mixture dissolves and becomes very viscous and then stirring is stopped. The solution is then poured onto a flat metallic sheet and air dried to remove any excess ammonia. After that the material is dried further in an oven to a thin film and then ball-milled to a dust. In essence, after the addition of ammonium hydroxide, the product is completely reacted, and any other subsequent step is just drying and processing the material.

In general, the method of forming a poly(tetrazole) includes the following steps, as explained in more detail above:

1. providing a reaction vessel;

2. adding water, at least one azide salt, at least one surfactant, at least one divalent zinc halide, and at least one polymer containing cyano or nitrile functionality to the reaction vessel, wherein the order of adding the water, the azide salt, the surfactant, the divalent zinc halide, and the polymer to the reactant vessel may be varied;

3. mixing the contents of the reaction vessel into a liquid mixture to react the mixture;

4. washing and filtering the contents of the reaction vessel to produce a filtrate/water mixture;

5. acidifying the filtrate/water mixture to a pH of about 1-3 and stirring the same to form a solid in solution.

6. filtering the acidified filtrate/water mixture to separate a solid from the acidified filtrate/water mixture;

7. suspending the solid in water and adding an excess amount of a base such as ammonium hydroxide to the suspension while stirring the same;

8. dissolving the solid in the base/water mixture to form a slurry; and 9. pouring the slurry into a container and drying the slurry to form a final solid.

By using a water-based system, the need for expensive and possibly toxic and/or flammable organic solvents is eliminated. The overall cost is therefore dramatically reduced while at the same time safety is enhanced. The intermediate zinc complex is easily filtered from the reaction media and easily converted into the corresponding acid, and then finally easily converted further to the water-soluble polyelectrolyte salt.

The present description is for illustrative purposes only, and should not be construed to limit the breadth of the present invention in any way. Thus, those skilled in the art will appreciate that various modifications could be made to the presently disclosed embodiments without departing from the scope of the present invention as defined in the appended claims.

What is claimed is:

1. An article including a product formed by the method comprising the steps of:
    providing a reaction vessel;
    adding water to the reaction vessel;
    adding at least one azide salt to the reaction vessel;
    adding at least one surfactant to the reaction vessel;
    adding at least one divalent zinc halide to the reaction vessel;
    adding at least one polymer containing cyano or nitrile functionality to the reaction vessel,
    wherein the order of adding the water, azide salt, surfactant and polymer to the reactant vessel may be varied;
    mixing the contents of the reaction vessel into a liquid mixture;
    heating the contents of the reaction vessel thereby reacting the contents of the reaction vessel;
    cooling the contents of the reaction vessel;
    filtering the contents of the reaction vessel to produce a filtrate;
    washing the filtrate with water to produce a filtrate/water mixture;
    dispersing the filtrate/water mixture into about 1.0-10 L of cold water and stirring the same;
    acidifying the dispersed filtrate/water mixture to a pH of about 1-3 and stirring the same;
    filtering the acidified filtrate/water mixture to separate a solid from the acidified filtrate/water mixture;
    washing the solid;
    suspending the solid in water and adding an excess amount of ammonium hydroxide to the suspension while stirring the same;
    dissolving the solid in the ammonium hydroxide mixture to form a slurry; and
    pouring the slurry into a container and drying the slurry to form a final solid,
    wherein said product is selected from one of the group consisting of ammonium poly(c-vinyl)tetrazole, ammonium poly(2-methyl-5-vinyl)tetrazole, ammonium poly(cyanoacrylate), ammonium poly(acrylonitrile/butadiene), and ammonium poly(styrene/acrylonitrile).

2. An article including a composition formed by the method comprising the steps of:
    providing a reaction vessel;
    adding water, at least one azide salt, at least one surfactant, at least one divalent zinc halide, and at least one polymer containing cyano or nitrile functionality to the reaction vessel, wherein the order of adding the water, the azide salt, the surfactant, the divalent zinc halide, and the polymer to the reactant vessel may be varied;

mixing the contents of the reaction vessel into a liquid mixture to react the mixture;

washing and filtering the contents of the reaction vessel to produce a filtrate/water mixture;

acidifying the filtrate/water mixture to a pH of about 1-3 and stirring the same thereby forming a solid in solution;

suspending the solid in water and adding an excess amount of a base to the suspension while stirring the same;

dissolving the solid in the base/water mixture to form a slurry; and pouring the slurry into a container and drying the slurry to form a final solid, wherein said final solid is selected from one of the group consisting of ammonium poly(c-vinyl) tetrazole, ammonium poly(2-methyl-5-vinyl)tetrazole, ammonium poly(cyanoacrylate), ammonium poly(acrylonitrile/butadiene), and ammonium poly(styrene/acrylonitrile).

3. A gas generator containing a product formed by the method comprising the steps of:

providing a reaction vessel;

adding water, at least one azide salt, at least one surfactant, at least one divalent zinc halide, and at least one polymer containing cyano or nitrile functionality to the reaction vessel, wherein the order of adding the water, the azide salt, the surfactant, the divalent zinc halide, and the polymer to the reactant vessel may be varied;

mixing the contents of the reaction vessel into a liquid mixture to react the mixture;

washing and filtering the contents of the reaction vessel to produce a filtrate/water mixture;

acidifying the filtrate/water mixture to a pH of about 1-3 and stirring the same thereby forming a solid in solution;

suspending the solid in water and adding an excess amount of a base to the suspension while stirring the same;

dissolving the solid in the base/water mixture to form a slurry; and pouring the slurry into a container and drying the slurry to form a final solid, wherein said final solid is selected from one of the group consisting of ammonium of poly(c-vinyl) tetrazole, ammonium poly(2-methyl-5-vinyl)tetrazole, ammonium poly(cyanoacrylate), ammonium poly(acrylonitrile/butadiene), and ammonium poly(styrene/acrylonitrile).

4. A substrate containing a coating formed by the method comprising the steps of:

providing a reaction vessel;

adding water to the reaction vessel;

adding at least one azide salt to the reaction vessel;

adding at least one surfactant to the reaction vessel;

adding at least one divalent zinc halide to the reaction vessel;

adding at least one polymer containing cyano or nitrile functionality to the reaction vessel, wherein the order of adding the water, azide salt, surfactant and polymer to the reactant vessel may be varied;

mixing the contents of the reaction vessel into a liquid mixture;

heating the contents of the reaction vessel thereby reacting the contents of the reaction vessel;

cooling the contents of the reaction vessel;

filtering the contents of the reaction vessel to produce a filtrate;

washing the filtrate with water to produce a filtrate/water mixture;

dispersing the filtrate/water mixture into about 1.0-10 L of cold water and stirring the same;

acidifying the dispersed filtrate/water mixture to a pH of about 1-3 and stirring the same;

filtering the acidified filtrate/water mixture to separate a solid from the acidified filtrate/water mixture;

washing the solid;

suspending the solid in water and adding an excess amount of ammonium hydroxide to the suspension while stirring the same;

dissolving the solid in the ammonium hydroxide mixture to form a slurry; and pouring the slurry into a container and drying the slurry to form a final solid, wherein said final solid is selected from one of the group consisting of ammonium poly(c-vinyl) tetrazole, ammonium poly(2-methyl-5-vinyl)tetrazole, ammonium poly(cyanoacrylate) ammonium poly(acrylonitrile/butadiene), and ammonium poly(styrene/acrylonitrile).

5. A substrate containing a coating formed by the method comprising the steps of:

providing a reaction vessel;

adding water, at least one azide salt, at least one surfactant, at least one divalent zinc halide, and at least one polymer containing cyano or nitrile functionality to the reaction vessel, wherein the order of adding the water, the azide salt, the surfactant, the divalent zinc halide, and the polymer to the reactant vessel may be varied;

mixing the contents of the reaction vessel into a liquid mixture to react the mixture;

washing and filtering the contents of the reaction vessel to produce a filtrate/water mixture;

acidifying the filtrate/water mixture to a pH of about 1-3 and stirring the same thereby forming a solid in solution;

suspending the solid in water and adding an excess amount of a base to the suspension while stirring the same;

dissolving the solid in the base/water mixture to form a slurry; and pouring the slurry into a container and drying the slurry to form a final solid, wherein said final solid is selected from one of the croup consisting of ammonium poly(c-vinyl) tetrazole, ammonium poly(2-methyl-5-vinyl)tetrazole, ammonium poly(cyanoacrylate), ammonium poly(acrylonitrile/butadiene), and ammonium poly(stryene/acrylonitrile).

6. An article containing the product formed by the method including the steps of:

providing a reaction vessel;

adding water, at least one azide salt, at least one surfactant, at least one divalent zinc halide, and at least one polymer containing cyano or nitrile functionality to the reaction vessel, wherein the order of adding the water, the azide salt, the surfactant, the divalent zinc halide, and the polymer to the reactant vessel may be varied;

mixing the contents of the reaction vessel into a liquid mixture to react the mixture;

washing and filtering the contents of the reaction vessel to produce a filtrate/water mixture;

acidifying the filtrate/water mixture to a pH of about 1-3 and stirring the same;

filtering the acidified filtrate/water mixture to separate a solid from the acidified filtrate/water mixture;

suspending the solid in water and adding an excess amount of a base to the suspension while stirring the same;

dissolving the solid in the base/water mixture to form a slurry; and pouring the slurry into a container and drying the slurry to form a final solid, wherein said final solid is selected from one of the group consisting of ammonium poly(c-vinyl) tetrazole, ammonium poly(2-methyl-5-vinyl)tetrazol, ammonium poly(cyanoacrylate), ammonium and poly(acrylonitrile/butadiene), and ammonium poly(styrene/acrylonitrile).

7. A substrate containing a coating formed by the method including the steps of:
providing a reaction vessel;
adding water, at least one azide salt, at least one surfactant, at least one divalent zinc halide, and at least one polymer containing cyano or nitrile functionality to the reaction vessel, wherein the order of adding the water, the azide salt, the surfactant, the divalent zinc halide, and the polymer to the reactant vessel may be varied;
mixing the contents of the reaction vessel into a liquid mixture to react the mixture;
washing and filtering the contents of the reaction vessel to produce a filtrate/water mixture;
acidifying the filtrate/water mixture to a pH of about 1-3 and stirring the same;
filtering the acidified filtrate/water mixture to separate a solid from the acidified filtrate/water mixture;
suspending the solid in water and adding an excess amount of a base to the suspension while stirring the same;
dissolving the solid in the base/water mixture to form a slurry; and
pouring the slurry into a container and drying the slurry to form a final solid,
wherein said final solid is selected from one of the group consisting of ammonium poly(c-vinyl) tetrazole ammonium poly(2-methyl-5-vinyl)tetrazole ammonium poly(cyanoacrylate), ammonium poly(acrylonitrile/butadiene), and ammonium poly(styrene/acrylonitrile).

* * * * *

UNITED STATES PATENT AND TRADEMARK OFFICE
CERTIFICATE OF CORRECTION

PATENT NO. : 7,776,169 B2  
APPLICATION NO. : 11/497148  
DATED : August 17, 2010  
INVENTOR(S) : Miller et al.

It is certified that error appears in the above-identified patent and that said Letters Patent is hereby corrected as shown below:

Column 1, Line 27; Delete "-" after combustion.

Column 1, Line 27; Delete "-" after generate.

Column 7, Formula 2 please delete and replace

Delete                                                                           Replace Column 9, Line 57; Delete "-" after generant.

Column 19, Claim 3, Line 40; Delete "of" after ammonium.

Column 19, Claim 4, Line 53; Delete "nitrite" and insert --nitrile--.

Column 20, Claim 5, Line 39; Delete "croup" and insert --group--.

Column 20, Claim 5, Line 43; Delete "stryene" and insert --styrene--.

Column 21, Claim 6, Line 4; Delete "and" after ammonium.

Signed and Sealed this  
First Day of February, 2011

David J. Kappos  
*Director of the United States Patent and Trademark Office*